US008281782B2

(12) United States Patent
Simon

(10) Patent No.: US 8,281,782 B2
(45) Date of Patent: Oct. 9, 2012

(54) METHOD AND APPARATUS FOR ARRANGING A SOLAR CELL AND REFLECTOR

(76) Inventor: Daniel Simon, Chicago, IL (US)

( * ) Notice: Subject to any disclaimer, the term of this patent is extended or adjusted under 35 U.S.C. 154(b) by 0 days.

(21) Appl. No.: 12/849,075

(22) Filed: Aug. 3, 2010

(65) Prior Publication Data
US 2010/0294365 A1 Nov. 25, 2010

Related U.S. Application Data

(62) Division of application No. 11/497,755, filed on Aug. 2, 2006.

(51) Int. Cl.
F24J 2/46 (2006.01)

(52) U.S. Cl. ........ 126/623; 126/596; 126/621; 126/622; 126/684; 126/685; 126/687; 126/692; 126/702; 126/704; 136/248; 136/251

(58) Field of Classification Search .................. 126/569, 126/621, 622, 623, 684, 685, 687, 692, 702, 126/704; 359/529
See application file for complete search history.

(56) References Cited

U.S. PATENT DOCUMENTS

| 3,116,171 | A | * | 12/1963 | Rongved et al. | ............... | 136/245 |
| 3,419,434 | A | * | 12/1968 | Colehower | ................... | 136/246 |
| 3,427,200 | A | | 2/1969 | Lapin et al. | | |
| 4,064,867 | A | | 12/1977 | Schlesinger | | |
| 4,078,747 | A | | 3/1978 | Minovtch | | |
| 4,090,559 | A | | 5/1978 | Megerlin | | |
| 4,095,997 | A | | 6/1978 | Griffiths | | |
| 4,154,219 | A | * | 5/1979 | Gupta et al. | .................. | 126/575 |
| 4,191,170 | A | * | 3/1980 | Carrell | .......................... | 126/583 |

(Continued)

FOREIGN PATENT DOCUMENTS
DE 2552598 A * 6/1977

OTHER PUBLICATIONS
PCT Search Report, Sep. 8, 2008, Simon, p. 3.
(Continued)

Primary Examiner — Kenneth Rinehart
Assistant Examiner — Jorge Pereiro
(74) Attorney, Agent, or Firm — Clifford Kraft

(57) ABSTRACT

A system and method of arranging a solar cell and reflector to replace a typical solar cell oriented normal to the incoming sunlight inside a module (i.e. parallel to a module's transparent cover plate or opening). The present invention in a preferred embodiment uses a solar cell oriented at a 45 degree angle to the incoming sunlight, and a reflective surface oriented perpendicular to the cell and at a 45 degree angle to the incoming sunlight. The solar cell and the mirror are the same length/size and form a V shape where the angle between the sloped sides is 90 degrees. Any light falling normally on the arrangement will hit the solar cell either directly or after reflection. In another embodiment, two adjacent reflectors can be used making angles of around 60 degrees and around 30 degrees with respect to the cover or opening. An alternate embodiment can include a second reflector added to the base of the cell and reflector pairings also at an approximate 45 degree angle with the cover or opening. The second reflector can run along an entire row of cell and first reflector pairs such that the first reflectors form 90 degree angles with both the cells and with the second reflector.

13 Claims, 4 Drawing Sheets

U.S. PATENT DOCUMENTS

| | | | |
|---|---|---|---|
| 4,201,188 A * | 5/1980 | Cummings | 126/621 |
| 4,248,643 A | 2/1981 | Peters | |
| 4,262,659 A * | 4/1981 | Brzezinski | 126/667 |
| 4,292,957 A | 10/1981 | Golder | |
| 4,296,733 A * | 10/1981 | Saunders | 126/619 |
| 4,296,736 A * | 10/1981 | Soot | 126/621 |
| 4,329,978 A * | 5/1982 | Wormser et al. | 126/684 |
| 4,368,725 A * | 1/1983 | McClintock | 126/595 |
| 4,410,757 A * | 10/1983 | Stamminger et al. | 136/248 |
| 4,637,376 A | 1/1987 | Varney et al. | |
| 4,742,813 A * | 5/1988 | Riehl et al. | 126/577 |
| 4,841,672 A * | 6/1989 | Nebhuth et al. | 49/25 |
| 4,867,134 A * | 9/1989 | O'Brien | 126/675 |
| 5,121,307 A * | 6/1992 | Moore | 362/183 |
| 5,511,537 A * | 4/1996 | Hively | 126/702 |
| 5,877,874 A | 3/1999 | Rosenberg | |
| 5,994,641 A | 11/1999 | Kardauskas | |
| 6,087,579 A | 7/2000 | Muskatevc | |
| 6,091,017 A * | 7/2000 | Stern | 136/246 |
| 6,274,860 B1 | 8/2001 | Rosenberg | |
| 6,359,274 B1 | 3/2002 | Nixon et al. | |
| 6,551,347 B1 | 4/2003 | Elkins | |
| 6,753,692 B2 * | 6/2004 | Toyomura et al. | 324/718 |
| 6,806,415 B2 | 10/2004 | Fujisaki et al. | |
| 7,077,124 B2 * | 7/2006 | Szymocha | 126/643 |
| RE40,227 E * | 4/2008 | Cobb, Jr. | 359/831 |
| 2001/0040453 A1* | 11/2001 | Toyomura et al. | 324/332 |
| 2005/0022858 A1 | 2/2005 | Terao et al. | |
| 2006/0174930 A1* | 8/2006 | Murphy et al. | 136/246 |
| 2007/0171418 A1 | 7/2007 | Nyhart | |

OTHER PUBLICATIONS

PCT Preliminary Report, Feb. 12, 2009, Simon, pp. 8-11.

* cited by examiner

METHOD AND APPARATUS FOR ARRANGING A SOLAR CELL AND REFLECTOR

This is a divisional of co-pending application Ser. No. 11/497,755 filed Aug. 2, 2006. application Ser. No. 11/497,755 is hereby incorporated by reference.

BACKGROUND

1. Field of Invention

This invention relates generally to solar panels and more specifically to an improved arrangement of a solar cell and reflector in a module or panel.

2. Description of the Prior Art

There is a significant interest in the commercial application of solar energy. One of the main obstacles to widespread use of solar energy is the high cost of solar devices, especially solar photovoltaic cells. This is because of the relatively high cost of materials used to convert solar energy (especially relative to reflector material). It is well known in the art to use a solar cell for intercepting sunlight and producing energy of thermal or electrical nature (or a combination of both). A solar cell generally can mean a receiver or thermal absorbing plate (for solar thermal applications) or a solar photovoltaic cell (for solar electrical applications). Cells are frequently connected or joined to other cells either in parallel or in series within a single plane like tiles on a floor, and once a useful number of them are assembled, they are generally enclosed in what is commonly called a module.

A module normally has a transparent cover, parallel to and above the plane of the solar cells, which allows sunlight to enter the module and strike the solar cells. The module will frequently have sides and a backing plate that define a weather tight enclosure that help shield the solar cell from the elements.

The prior art contains many examples of arranging the solar cells within a module. Reflectors are frequently used to minimize regions between active solar cells where entering sunlight would produce no energy. Much of the prior art assumes the solar cells are arranged in a single plane normal to the incoming sunlight and parallel to the transparent cover, such as: U.S. Pat. Nos. 6,528,716 and 4,316,448 Disadvantages of these types of arrangements primarily include the inefficient or wasteful use of expensive materials.

The prior art also contains examples of more complex geometries where a significant portion of incoming light is reflected from one or more surfaces onto the cell. Some examples of this are U.S. Pat. Nos. 5,538,563, 4,471,763 and 2,904,612 Disadvantages of these types of arrangements are complex geometries or the requirement of mechanical tracking systems which add to the cost of system manufacture and maintenance.

A reflector and solar collector in an angular orientation is taught by Epsy in U.S. Pat. No. 4,120,282. U.S. Pat. No. 4,120,282 is hereby incorporated by reference. Espy teaches a complex and variable geometry that depends on user location, which makes mass production difficult. Furthermore, the arrangement described by Espy does not contain protection for the reflector or collector surfaces. The result is that one or both of these surfaces can be easily damaged by the elements.

SUMMARY OF THE INVENTION

The present invention relates to a method and apparatus for arranging a solar cell and reflector to replace a typical solar cell oriented normal to the incoming sunlight inside a module (i.e. parallel to a module's transparent cover plate or opening). The present invention in a preferred embodiment uses a solar cell oriented at a 45 degree angle to the incoming sunlight, and a reflective surface oriented perpendicular to the cell and at a 45 degree angle to the incoming sunlight. The solar cell and the mirror are the same length/size and form a V shape where the angle between the sloped sides is 90 degrees. Any light falling normally on the arrangement will hit the solar cell either directly or after reflection. In another embodiment, two adjacent reflectors can be used making angles of around 60 degrees and around 30 degrees with respect to the cover or opening. An alternate embodiment can include a second reflector placed perpendicular and at the base of the cell and first reflector pairing, also at an approximate 45 degree angle with the cover or opening.

OBJECTS AND ADVANTAGES

1. A simple arrangement that allows either more sunlight to be captured with the same area of solar cell, or the same amount of sunlight can be captured with a smaller solar cell.
2. Most prior art practices of module making remain the same with the present invention, with the exception that a deeper module/enclosure is needed, as well as a way to support the reflector and solar cell in their new orientation. The wiring or plumbing that was typically built along the back surface of the solar cell, or row of solar cells, is generally unaffected by the new orientation.
3. The reflector and cell arrangement of the present invention are protected from the elements and it can be used with many types of solar cell technologies and will uniformly illuminate the solar cell surface.
4. The reflector can be designed to reflect only the solar spectrum that generates electricity (for a PV solar cell) but not the infrared parts that might overheat the cell and reduce performance.

Further objects and advantages of my invention will become apparent from a consideration of the drawings and ensuing description.

Several illustrations and drawings have been presented to better aid in understanding of the present invention. The scope of the present invention is not limited what the figures.

DETAILED DESCRIPTION OF THE INVENTION

Figure 1:
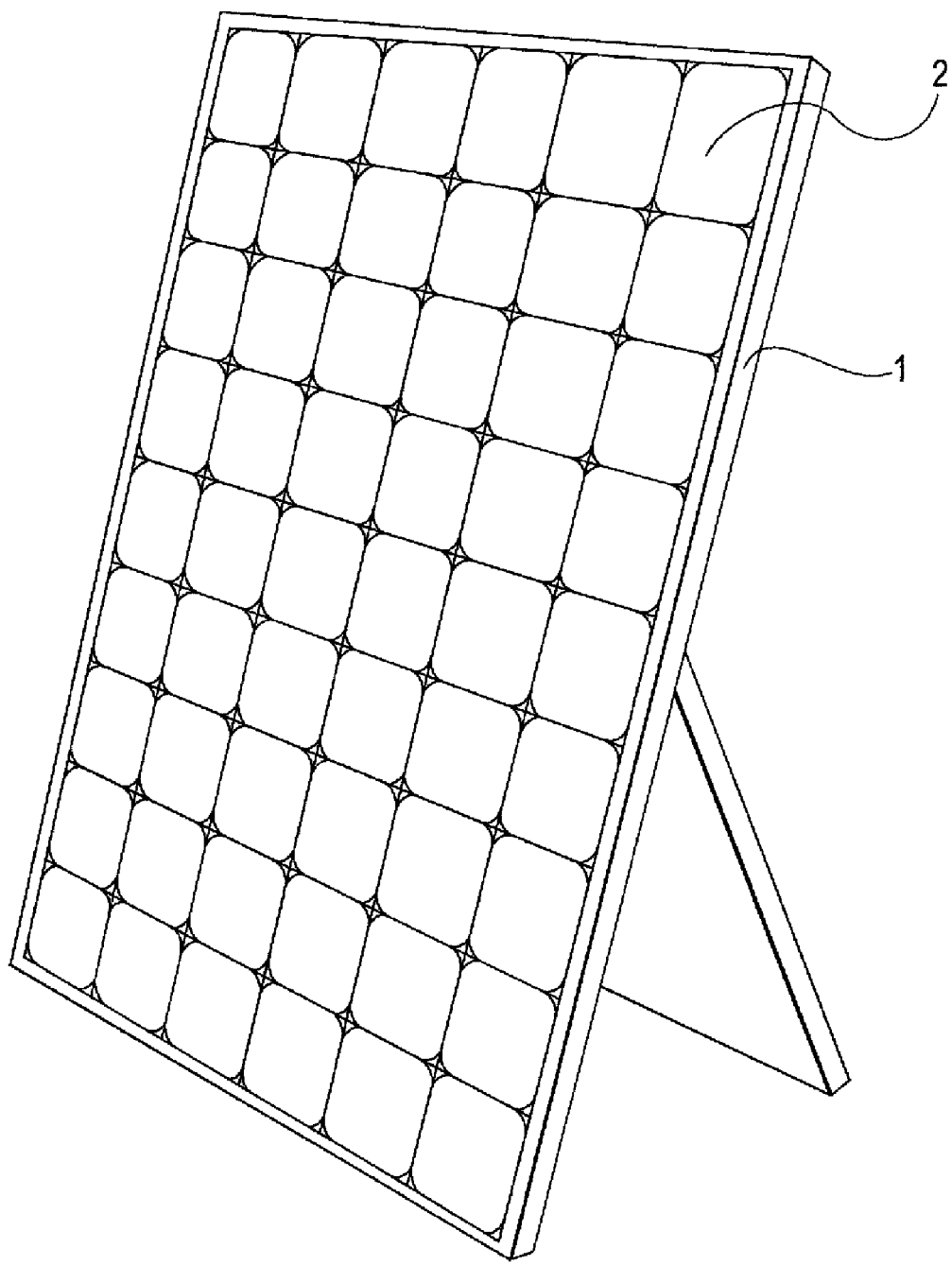
FIG. 1 shows an perspective view a prior art arrangement of solar cells in tiled configuration parallel to a module cover.

FIG. 1 shows a prior art method of making a solar panel. A frame 1 is built and either supported or attached to a roof with flat, tiled panels 2 that contain solar cells. Tiles may have weather-tight covers to protect the cells. This arrangement does not lead to optimum efficiency in the amount of light striking the cells.

Figure 2:
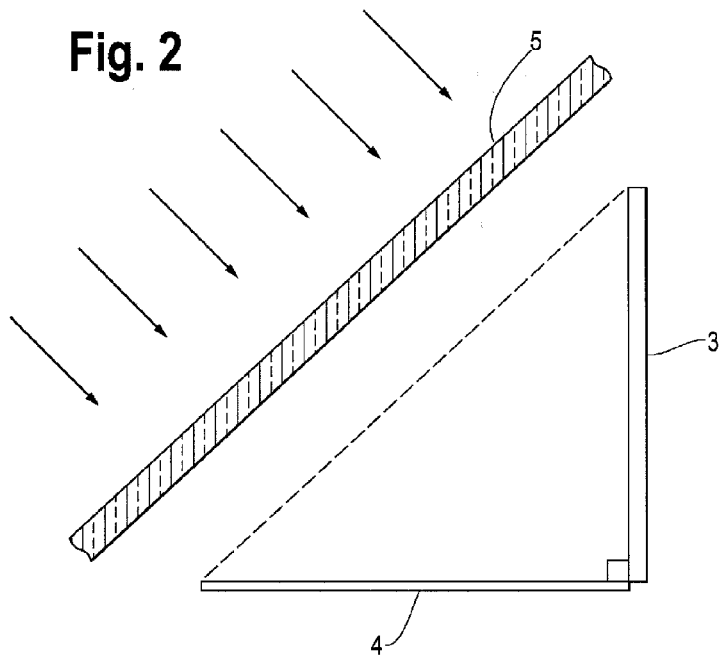
FIG. 2. shows a side view of a reflector and solar cell at a 90 degree angle to each other (below the plane of prior art orientation).

FIG. 2 shows a side view of an embodiment of the present invention. A solar cell 3 is rotated at around a 45 degree angle to module cover 5. A reflector 4, also at around a 45 degree angle to module cover 5 is located approximately perpendicular to and adjacent to solar cell 3. The reflector 4 can be equivalent in length and width to solar cell 3. The reflector 4 and solar cell 3 form a V-shape with the opening parallel to module cover 5. Light that enters the module perpendicular to the module cover 5 will hit the solar cell 3 (at a 45 degree angle) directly or after reflecting off reflector 4. The solar cell 3 combined with the reflector 4 in this orientation collects the same amount of energy as a cell 30% larger oriented parallel to a module cover as shown in prior art FIG. 1.

Figure 3:
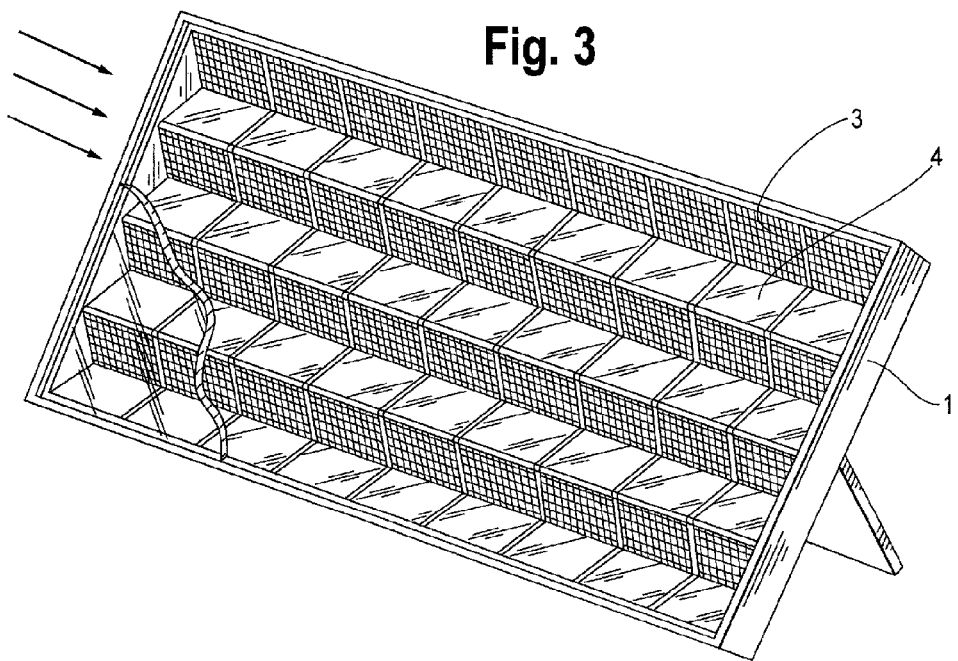
FIG. 3 shows a perspective view of multiple rows of reflectors and cells (saw-tooth style) within a module.

FIG. 3 shows an parametric view of a solar module with a frame 1 holding an array completely populated with solar cell 3 and reflector 4 pairings, all at a 45 degree angle to module cover. Although each reflector 4 is shown individually (for clarity), a single extended reflector can be used extending from one end of the module to the other, in place of the nine reflectors per row shown in FIG. 3.

Figure 4:
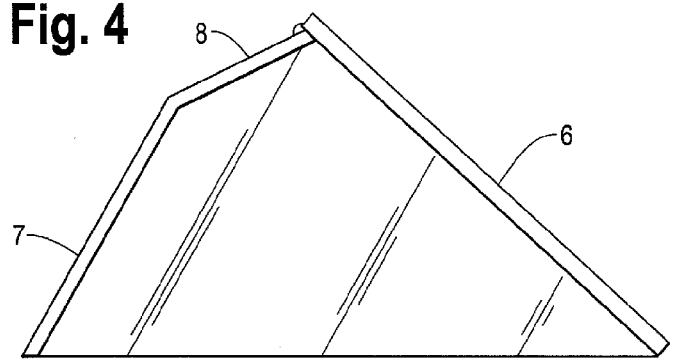
FIG. 4 shows a side view of reflectors (60 deg and 30 deg) and a solar cell at 45 degree angles to the original horizontal cell plane.
Figure 5:
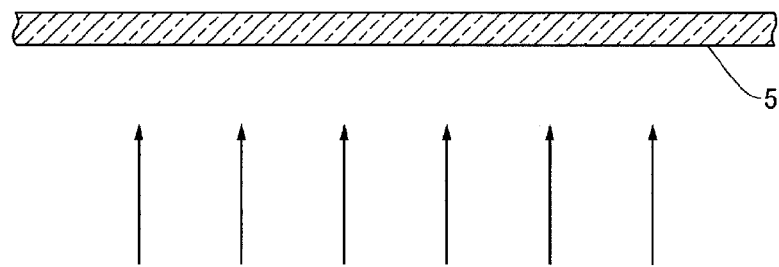
FIG. 5 shows a perspective view of an array made from the embodiment of FIG. 4.
Figure 5:
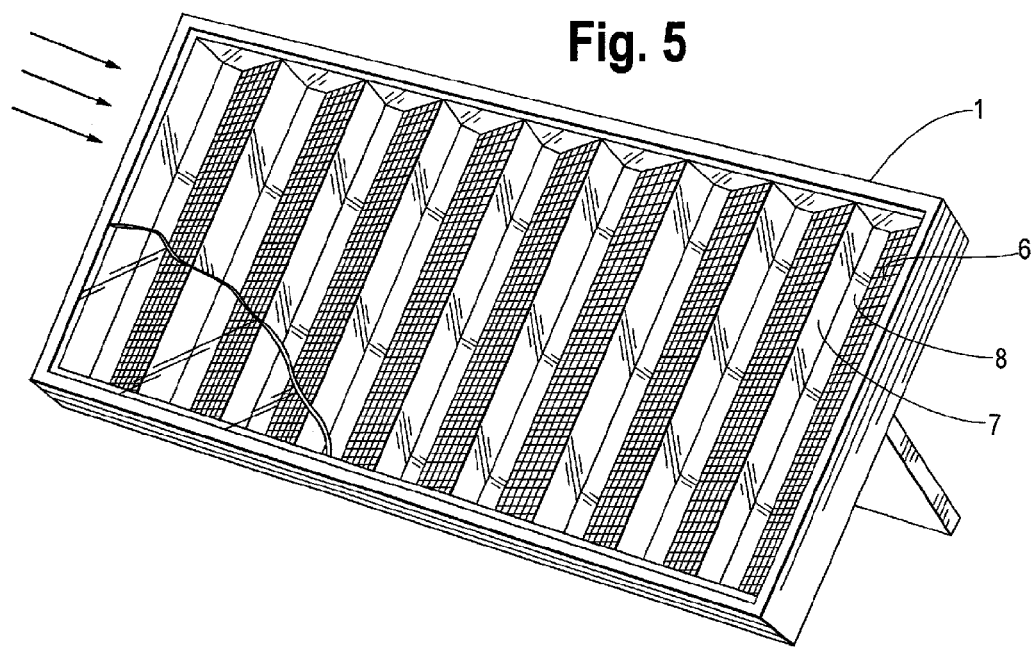

FIG. 4 shows a side view of an alternate embodiment of the present invention. Here, the solar cell 6 can generally be longer than solar cells shown in FIG. 3. This solar cell 6 remains rotated at around a 45 degree angle to the module cover 5. A first reflector 7 is rotated at around a 60 degree angle to the module cover 5, and a second reflector 8 makes around a 30 degree angle to the module cover 5. The upper edge of the first reflector 7 is approximately adjacent to the lower edge of the second reflector 8. The lower edge of the first reflector 7 is adjacent to the lower edge of the solar cell 6, forming around a 105 degree angle between the first reflector 7 and the solar cell 6. FIG. 5 shows a perspective view of an array made from the cell-reflector arrangement of FIG. 4. The frame 1 holds the solar cells 6 and the two reflector parts 7, 8. The alternative embodiment of FIGS. 4-5 offers an alternative geometry that reflects light that might not otherwise hit the solar cell 6 onto it.

Figure 6:
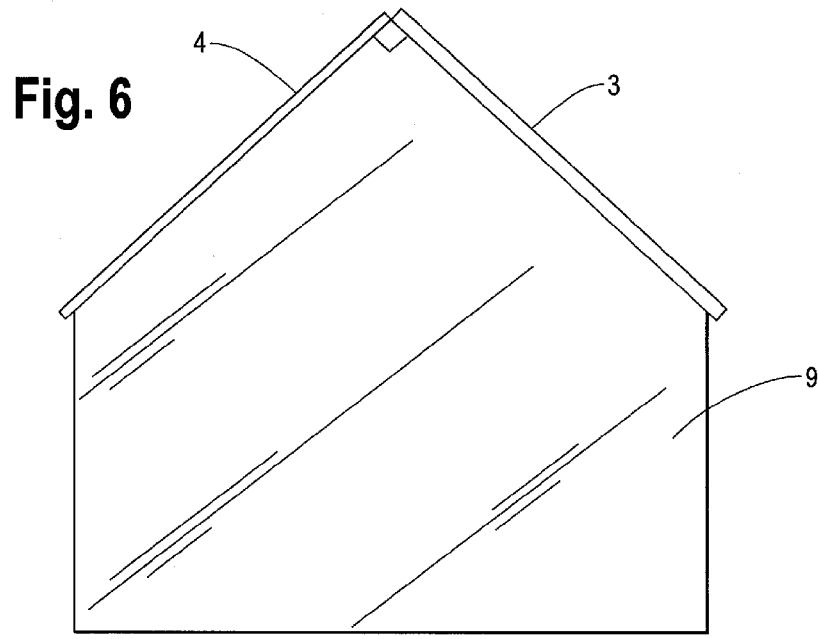
FIG. 6 shows a 45 degree angle-in view of an alternate embodiment.
Figure 6:
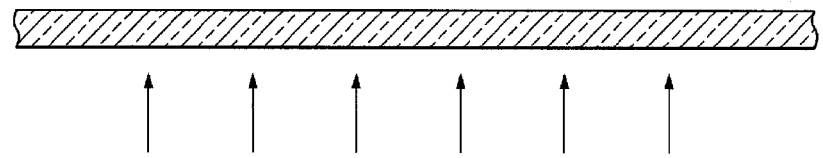
Figure 7:
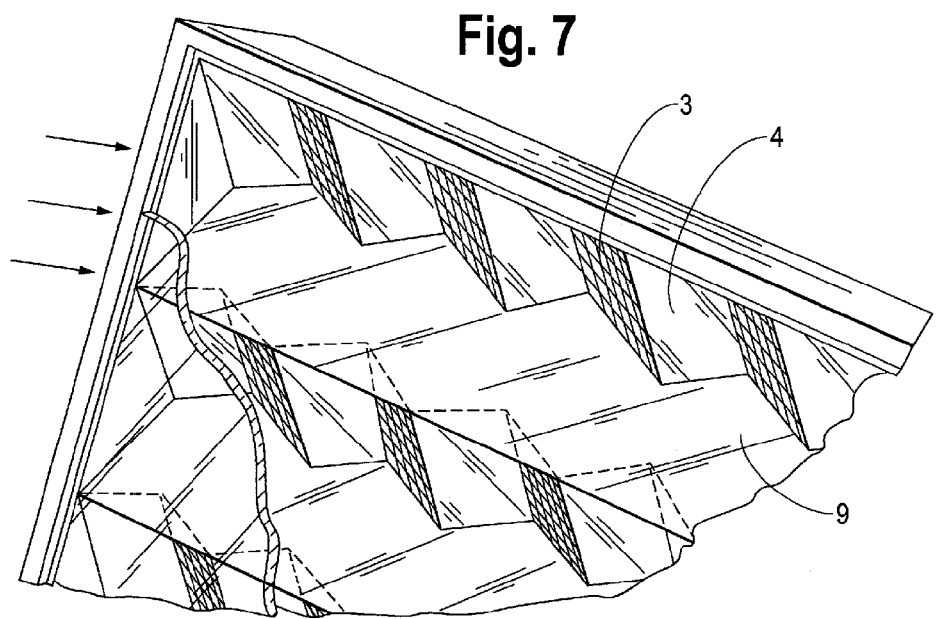
FIG. 7 shows embodiment of FIG. 6 with a more complex reflector-cell geometry with a new solar cell orientation replaced by a smaller perpendicular mirror and cell set rotated by 90 degrees.

FIGS. 6-7 show an alternate embodiment of the present invention where the cells 3 and the reflectors 4 are arranged as in FIG. 2, but rotated by 90 degrees, with an additional end reflector 9. This arrangement allows better light collection (i.e. higher concentration of light) from a particular set of daily sun angles (i.e. the morning-noon solar arc, or the mid-morning to mid-afternoon solar arc, or the noon-afternoon solar arc) for different orientations of the frame 1. FIG. 6 is a view looking straight down on the additional reflector 9, and FIG. 7 is a perspective view. This embodiment has the advantage of capturing more light from daily sun angles. Specifically, this embodiment can capture twice as much sunlight per area of solar receiver as the prior art, but only during half of the day. A solar panel constructed according to this embodiment might practically be located on the east or west facing portions of buildings in locations where prior art panels are impractical due to diurnal shading.

In all embodiments, the reflective surfaces can optionally be designed to not reflect the infrared (heating) wavelengths of sunlight onto solar cell if desired. This is especially useful if the cell is a photovoltaic cell that produces less electricity as the cell temperature rises. In this manner, only useful wavelengths can be directed to the cell from the reflectors.

Several descriptions and illustrations have been presented to aid in understanding the present invention. One of skill in the art will realize that numerous changes and variations are possible without departing from the spirit of the invention. Each of these changes and variations is within the scope of the present invention.

I claim:

1. A light collecting system comprising:
   a frame having a cover;
   a first reflector secured to said frame;
   at least one second reflector secured to said frame and disposed perpendicularly to said first reflector;
   at least one solar cell secured to said frame and disposed perpendicularly to said first and second reflector, wherein said first reflector forms a 45 degree angle with said cover.

2. The light collecting system of claim 1 further comprising a plurality of adjacent alternating solar cells and first reflectors adjacent to a single second reflector in said frame to form a solar collecting row.

3. The light collecting system of claim 2 further comprising mounting a plurality of solar collecting rows in said frame.

4. The light collecting system of claim 1 wherein said first and second reflectors are aluminum.

5. The light collecting system of claim 1 wherein said solar cell is a photovoltaic cell.

6. The light collecting system of claim 1 wherein at least one of said first or second reflectors has a coating that reflects primarily a band of light wavelengths the photovoltaic cell converts efficiently to electricity, while not reflecting infrared wavelengths that tend to heat said photovoltaic cell.

7. A method for collecting useful sunlight comprising:
   mounting a first reflective surface in an enclosure having four sides, a base and a transparent cover;
   mounting a second reflective surface in said frame perpendicular and adjacent to said first reflective surface;
   mounting a solar collecting surface in said frame perpendicular and adjacent to said first and second reflective surfaces; wherein said first reflective surface forms a 45 degree angle with said transparent cover.

8. The method of claim 7 further comprising mounting a plurality of adjacent alternating solar collecting surfaces and first reflective surfaces adjacent to a single second reflecting surface in said frame to form a solar collecting row.

9. The method of claim 8 further comprising mounting a plurality of solar collecting rows in said frame.

10. The method of claim 7 wherein said solar collecting surface absorbs solar radiation and transfers it to a working fluid.

11. The solar collector of claim 7 wherein said solar collecting surface contains at least one photovoltaic cell for converting light to electricity.

12. The solar collector of claim 7 wherein said first and second reflectors are aluminum.

13. A system with surfaces arranged for maximizing collection of useful sunlight, comprising
   an enclosure including four sides, a base, and a transparent cover that protects interior surfaces from weather;
   at least one rectangular solar collecting surface having an uppermost and lowermost edge mounted at a 45 degree angle to the transparent cover;
   first and second reflective surfaces each having top and bottom edges in proximity to said solar collecting surface, wherein said first reflective surface is mounted at an angle of between around 46-60 degrees to the transparent cover, said first reflective surface extending downward to a point where a line perpendicular to the bottom edge of said first reflective surface contacts the uppermost edge of said solar collecting surface, and wherein said second reflective surface is mounted adjacent to the bottom edge of said first reflective surface at a an angle complimentary to the first reflective surface's mounting angle, said second reflective surface extending downward until its bottom edge is adjacent to the lowermost edge of said solar collecting surface; wherein said solar collecting surface absorbs solar radiation and transfers it to a working fluid; and wherein said reflective surfaces have a coating that reflects primarily a band of light wavelengths the photovoltaic cell converts efficiently to electricity, while not reflecting infrared wavelengths that tend to heat said photovoltaic cell.

* * * * *